United States Patent
Lukyanchuk et al.

(10) Patent No.: US 11,803,002 B2
(45) Date of Patent: Oct. 31, 2023

(54) DEVICE WITH A HETEROSTRUCTURE ADAPTED TO BE APPLIED AS A RESONATOR FOR ELECTRONS OF AN ELECTRICAL CIRCUIT OR FOR A TERAHERTZ ELECTROMAGNETIC WAVE

(71) Applicant: Terra Quantum AG, St. Gallen (CH)

(72) Inventors: Igor Lukyanchuk, St. Gallen (CH);
Anna Razumnaya, St. Gallen (CH);
Valerii Vinokour, St. Gallen (CH)

(73) Assignee: Terra Quantum AG, St. Gallen (CH)

( * ) Notice: Subject to any disclaimer, the term of this patent is extended or adjusted under 35 U.S.C. 154(b) by 0 days.

(21) Appl. No.: 17/685,996

(22) Filed: Mar. 3, 2022

(65) Prior Publication Data

US 2022/0283348 A1 Sep. 8, 2022

(30) Foreign Application Priority Data

Mar. 3, 2021 (EP) .................... 21160551

(51) Int. Cl.
*G02B 5/30* (2006.01)
*G02B 5/28* (2006.01)
*G01N 21/3581* (2014.01)

(52) U.S. Cl.
CPC ............ *G02B 5/284* (2013.01); *G02B 5/281* (2013.01); *G02B 5/3033* (2013.01); *G01N 21/3581* (2013.01)

(58) Field of Classification Search
CPC ........ G01N 21/31; G01N 21/35; G01N 21/00; G02B 5/28; G02B 5/30

(Continued)

(56) References Cited

U.S. PATENT DOCUMENTS 7,272,158 B1 * 9/2007 Hayes .................... G02F 1/365
372/4
2008/0107885 A1 5/2008 Alpay et al.
(Continued)

FOREIGN PATENT DOCUMENTS

| JP | 2001-220300 A | 8/2001 |
| JP | 2009-26994 A | 2/2009 |
| JP | 2012-165032 A | 8/2012 |

OTHER PUBLICATIONS

European Patent Office, Extended European Search Report in European Patent Application No. 21160551.4 (dated Aug. 30, 2021).

(Continued)

*Primary Examiner* — Que Tan Le
(74) *Attorney, Agent, or Firm* — Leydig, Voit & Mayer, Ltd.

(57) ABSTRACT

A method employs a device with a heterostructure as a resonator for electrons of an electrical circuit or for a terahertz electromagnetic wave. The heterostructure comprises at least one dielectric layer and at least one ferroelectric layer. The at least one ferroelectric layer comprises a plurality of ferroelectric polarization domains. The plurality of ferroelectric polarization domains forms a polarization pattern. The polarization pattern is adapted to perform an oscillation with a resonance frequency in a terahertz frequency range. The method comprises functionally coupling the oscillation of the polarization pattern and an oscillation of the electrons of the electrical circuit or of the terahertz electromagnetic wave by the device.

14 Claims, 14 Drawing Sheets

(58) Field of Classification Search
USPC .................................. 250/225, 214 R, 208.1
See application file for complete search history.

(56) References Cited

U.S. PATENT DOCUMENTS

| | | |
|---|---|---|
| 2011/0148252 A1 | 6/2011 | Li et al. |
| 2019/0222100 A1 | 7/2019 | Matus et al. |
| 2020/0212532 A1 | 7/2020 | Gosavi et al. |
| 2020/0408677 A1 | 12/2020 | Salamin et al. |

OTHER PUBLICATIONS

Luk'yanchuk et al., "Electrodynamics of ferroelectric films with negative capacitance," Physical Review B, 98: 024107 (2018).
Japan Patent Office, Office Action in Japanese Patent Application No. 2022-029350, 7 pp. (dated Aug. 22, 2023).

\* cited by examiner

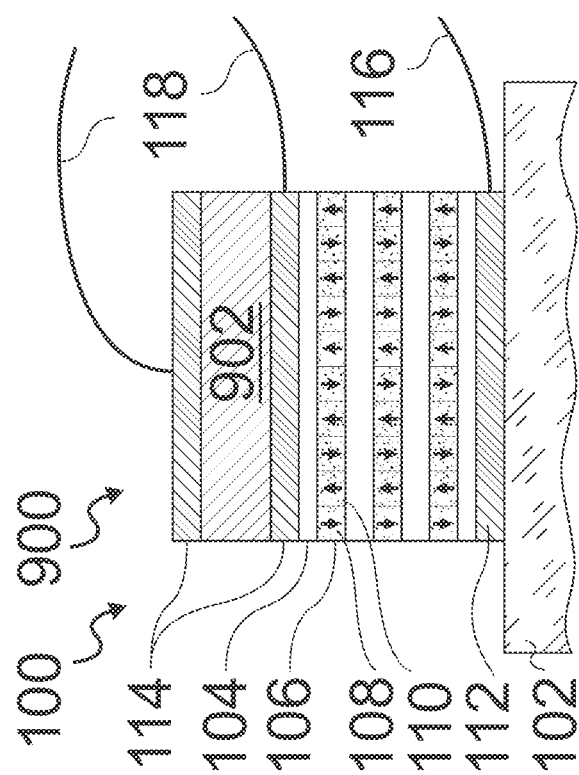
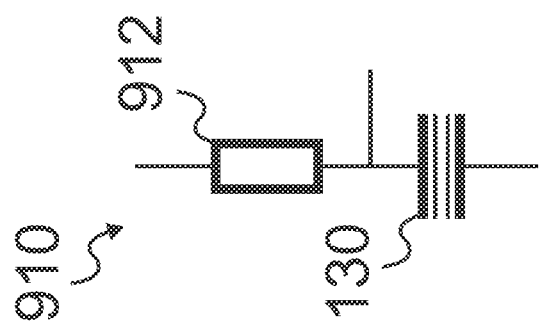
Fig. 9a
Fig. 9b

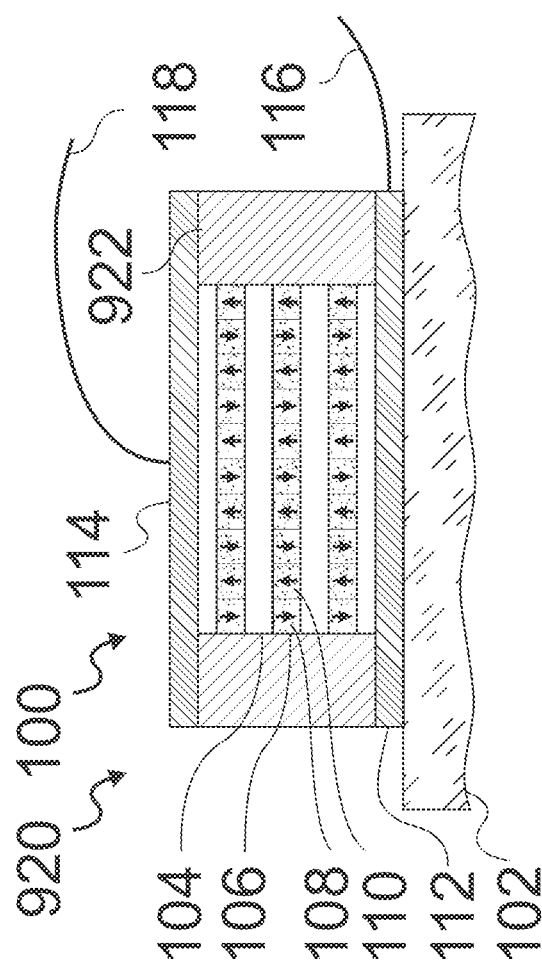
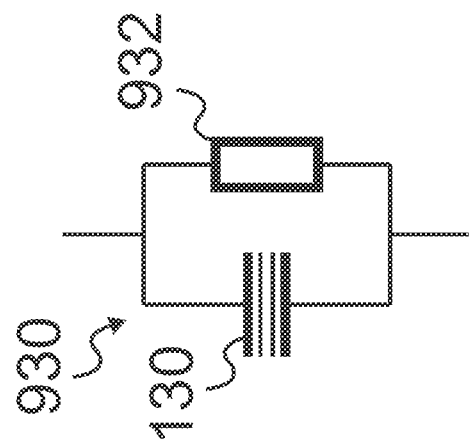
Fig. 9c
Fig. 9d

DEVICE WITH A HETEROSTRUCTURE ADAPTED TO BE APPLIED AS A RESONATOR FOR ELECTRONS OF AN ELECTRICAL CIRCUIT OR FOR A TERAHERTZ ELECTROMAGNETIC WAVE

CROSS-REFERENCE TO RELATED APPLICATIONS

This patent application is a convention application claiming priority to European Patent Application ser. no. EP21160551.4, filed on Mar. 3, 2021, which is incorporated herein by reference.

TECHNICAL FIELD

The disclosure relates to electrical resonator circuits, in particular to electrical resonators of integrated circuits.

BACKGROUND OF THE INVENTION

The semiconductor industry is driven by its goal to miniaturize integrated electronic circuitry and to increase its switching frequencies and speeds. Conventional, silicon-based integrated circuitry may at some point hit fundamental limits regarding switching frequencies dictated by the capacitance and inductivity of devices and by the energy losses during signal transmission. Concepts for faster circuitry and alternative transmission pathways are desirable. Signal transmission via electromagnetic waves rather than electronic transmission has been proposed. A development from nowadays gigahertz electronics to future terahertz electronics might allow for electronic signal processing and electromagnetic wave signal transmission at similar frequencies using the same or similar integrated electronic elements. Therefore, integrated elements to couple terahertz circuits and the electromagnetic fields are desirable.

Terahertz electromagnetic signal transmission and, in particular, reception can also be useful for existing applications, such as medical imaging and security screening, or in long scale signal transmission, for example in aerospace industry and space or satellite data communication.

Existing terahertz integrated electronic elements, like resonators required for signal transmission and reception, include split ring and split disc type resonators. The dimensions of these structures are determined by the terahertz wavelength and much larger than the typical, critical dimensions of silicon-based integrated circuitry. Improvements are desirable to allow for the miniaturization and co-integration of terahertz oscillators and resonators with miniaturized integrated circuitry.

BRIEF SUMMARY OF THE INVENTION

In view of the technical problems described above, there is a need for an improved method for coupling an oscillation in a terahertz spectral range of electrons of an electrical circuit or of a terahertz electromagnetic wave with a resonator, in particular a resonator which can be incorporated into a miniaturized integrated circuit.

In a first aspect, the disclosure relates to a method of employing a device with a heterostructure as a resonator for electrons of an electrical circuit or for a terahertz electromagnetic wave. The heterostructure comprises at least one dielectric layer and at least one ferroelectric layer. The at least one ferroelectric layer comprises a plurality of ferroelectric polarization domains forming a polarization pattern. The polarization pattern is adapted to perform an oscillation with a resonance frequency in a terahertz frequency range. The method comprises functionally coupling the oscillation of the polarization pattern and an oscillation of the electrons of the electrical circuit or of the terahertz electromagnetic wave by the device.

BRIEF DESCRIPTION OF THE SEVERAL VIEWS OF THE DRAWING(S)

FIG. 9a shows an integrated circuit comprising a Terahertz Ferroelectric Resonator (TFR) and a load resistor integrated in series according to another embodiment of the disclosure.

FIG. 9b shows a circuit diagram of the integrated circuit of FIG. 9a.

FIG. 9c shows an integrated circuit comprising a Terahertz Ferroelectric Resonator (TFR) and a load resistor integrated in parallel according to yet another embodiment of the disclosure.

FIG. 9d shows a circuit diagram of the integrated circuit of FIG. 9c.

DETAILED DESCRIPTION OF THE INVENTION

Figure 1B:
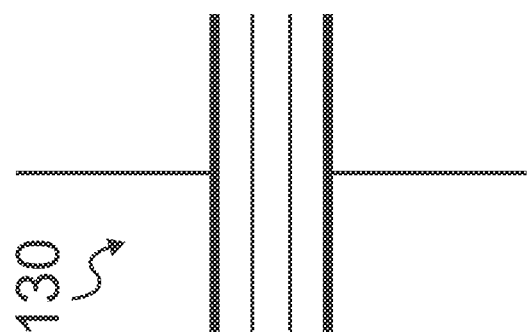
FIG. 1b shows an electronic graphical symbol for the Terahertz Ferroelectric Resonator (TFR).

The device with the heterostructure comprising at least one dielectric layer and at least one ferroelectric layer can be integrated into miniaturized integrated circuitry, which may provide advantages over existing terahertz resonators such as split ring resonators and split disc resonators. In particular, the lateral area of the device can be miniaturized, for example to the critical dimensions of nowadays' semiconductor devices. Moreover, the at least one ferroelectric layer and/or the at least one dielectric layer can be deposited using well-developed techniques of the layer deposition technology. Advantageously for the miniaturization, elements to provide significant inductance can be omitted in the device.

Advantageously, the at least one ferroelectric layer and the at least one dielectric layer may be formed from insulating materials, which may show very little response to oscillations, for example electromagnetic waves, at frequencies much lower or much higher than the resonance frequency, or at the frequencies of the oscillation of the polarization pattern, the electrons of the electrical circuit, or of the terahertz electromagnetic wave. This may suppress undesirable responses and noise which might otherwise result from the response to oscillations, for example electromagnetic waves, at much higher or much lower frequencies.

In the context of the present disclosure, a heterostructure may comprise a sandwich-like heterostructure or stacked heterostructure, a multilayer structure, and/or a superlattice.

The resonance frequency may be selected from a plurality of resonance frequencies of the heterostructure and/or of the polarization pattern. In particular, the resonance frequency may correspond to a principal resonance frequency of the plurality of resonance frequencies of the heterostructure and/or of the polarization pattern.

In addition, insulating materials of the at least one ferroelectric layer and/or the at least one dielectric layer may reduce the risk of undesirable electrical short circuiting across the device. Advantageously, the polarization pattern of the device has a resonance frequency in the terahertz spectral range which can be adjusted to the requirements of a specific application, for example by selecting suitable thicknesses of the at least one ferroelectric layer or the at least one dielectric layer, or by selecting a suitable material composition of the at least one ferroelectric layer and the at least one dielectric layer. The resonance frequency can advantageously be used for resonant coupling between the oscillation of the polarization pattern and the oscillation of the electrons of the electrical circuit or of the terahertz electromagnetic wave. Resonant coupling provides a particularly efficient coupling.

In the context of the present disclosure, the terahertz frequency range may comprise frequencies of at least 0.05 THz, in particular at least 0.1 THz or at least 0.2 THz.

In the context of the present disclosure, the terahertz frequency range may comprise frequencies up to 20 THz, in particular up to 10 THz or up to 3 THz.

The oscillation of the polarization pattern can have an oscillation frequency in a second terahertz frequency range.

The oscillation of the electrons of the electrical circuit or of the terahertz electromagnetic wave can have a coupling frequency in the second terahertz frequency range.

The second terahertz frequency range may comprise frequencies of at least 0.05 THz, in particular at least 0.1 THz or at least 0.2 THz.

The second terahertz frequency range may comprise frequencies up to 20 THz, in particular up to 10 THz or up to 3 THz.

The oscillation of the polarization pattern and/or the oscillation of the electrical circuit or of the terahertz electromagnetic wave with an oscillation frequency or a coupling frequency not too far from the resonance frequency of the polarization pattern may advantageously allow for efficient coupling between the oscillation of the polarization pattern and the oscillation of the electrical circuit or of the terahertz electromagnetic wave.

The oscillation of the polarization pattern may have an oscillation frequency, and the oscillation of the electrons of the electrical circuit or of the terahertz electromagnetic wave may have a coupling frequency, and the coupling frequency may match the oscillation frequency.

According to an embodiment of the disclosure, the oscillation frequency matches the resonance frequency.

The resulting resonant coupling can allow for a particularly efficient coupling between the oscillation of the polarization pattern and the oscillation of the electrons of the electrical circuit or of the terahertz electromagnetic wave.

According to an embodiment, the coupling frequency matches the resonance frequency.

The resulting resonant coupling can allow for a particularly efficient coupling between the oscillation of the polarization pattern and the oscillation of the electrons of the electrical circuit or of the terahertz electromagnetic wave.

Matching frequencies may deviate from one another at most by a factor of 2, in particular at most 1.5, or at most 1.1.

According to an embodiment, the heterostructure may comprise a plurality of ferroelectric layers. The plurality of ferroelectric layers may comprise at least three ferroelectric layers, in particular at least five, ten, twenty, or fifty ferroelectric layers.

In particular, the at least one ferroelectric layer may be at least one ferroelectric layer of the plurality of ferroelectric layers. The at least one ferroelectric layer may be or comprise a thickest ferroelectric layer of the plurality of ferroelectric layers, or a thinnest ferroelectric layer of the plurality of ferroelectric layers.

Each ferroelectric layer of the plurality of ferroelectric layers may comprise a plurality of ferroelectric polarization domains forming a polarization pattern.

According to an embodiment, each layer of the plurality of ferroelectric layers may have a same maximum ferroelectric layer thickness. In particular, each layer of the plurality of ferroelectric layers may have a same ferroelectric layer thickness, for example along a line intersecting the heterostructure, in particular along a line intersecting the heterostructure along a direction perpendicular to the at least one ferroelectric layer.

Alternatively or in addition, the heterostructure may comprise a plurality of dielectric layers. The plurality of dielectric layers may comprise at least three dielectric layers, in particular at least five, ten, twenty, or fifty dielectric layers.

In particular, the at least one dielectric layer may be at least one dielectric layer of the plurality of dielectric layers. The at least one dielectric layer may be or comprise a thickest dielectric layer of the plurality of dielectric layers, or a thinnest dielectric layer of the plurality of dielectric layers.

According to an embodiment, each layer of the plurality of dielectric layers may have a same maximum dielectric layer thickness. In particular, each layer of the plurality of dielectric layers may have a same dielectric layer thickness, for example along a line intersecting the heterostructure, in particular along a line intersecting the heterostructure along a direction perpendicular to the at least one dielectric layer.

The heterostructure may comprise an alternating stacking sequence of dielectric layers of the plurality of dielectric layers and ferroelectric layers of the plurality of ferroelectric layers.

Alternatively or in addition, the heterostructure may comprise a stacking sequence with at least two subsequent ferroelectric layers of the plurality of ferroelectric layers or with at least two subsequent dielectric layers of the plurality of dielectric layers.

Alternatively or in addition, the heterostructure may comprise a stacking sequence with at least one additional layer between a first layer of the plurality of ferroelectric layer or of the plurality of dielectric layers and a second layer of the plurality of the plurality of ferroelectric layer or of the plurality of dielectric layers.

A plurality of ferroelectric layers and/or a plurality of dielectric layers can increase the coupling volume and hence the strength of the coupling between the oscillation of the polarization pattern and the oscillation of the electrical circuit or of the terahertz electromagnetic wave.

According to an embodiment, the method further comprises employing the device as a component of a receiver or a transmitter for the terahertz electromagnetic wave.

Employing the device as a component of the receiver or the transmitter advantageously makes use of the coupling between the oscillation of the polarization pattern and the coupling of the electrons of the electrical circuit. This may be particularly useful for applications of the device related to inter-chip and/or intra-chip signal transmission and/or processing, 6G WiFi communication, and/or satellite communication.

According to an embodiment, the heterostructure is functionally coupled to a diode or a transistor. In particular, the device may be a component of the receiver, and the diode or the transistor serves as a rectifier.

As the device with the heterostructure can be integrated together with miniaturized semiconductor devices like the transistor and/or the diode, these well-established semiconductor devices can advantageously be used to implement a driver and/or a readout circuit for the resonator.

According to an embodiment, the device is a first component of a common integrated circuit and the diode or the transistor is a second component of the common integrated circuit. For example, the first component of the common integrated circuit and the second component of the common integrated circuit may be arranged on a common substrate. For example, the common substrate may be a semiconductor or dielectric substrate. In particular, the semiconductor or dielectric substrate may be a semiconductor or dielectric wafer.

According to an embodiment, the first component of the common integrated circuit and the second component of the common integrated circuit are arranged in direct physical contact with each other.

At least a layer of the device and at least a section of the second component of the common integrated circuit may be composed of the same material. The same material composition of the layer of the device and the section of the second component of the common integrated circuit may by the result of a common deposition step.

The device may be functionally coupled to an additional antenna. In particular, the additional antenna may be a split ring resonator or a split disc resonator.

According to an embodiment, the method further comprises applying the device as a component of an RC circuit. In particular, the device may be employed as a capacitor of the RC circuit.

The implementation of an RC circuit comprising the device provides a resonator with the potential to be highly miniaturized and integrated. In particular, the implementation as an RC circuit permits to omit significant inductances, which tend to require large lateral areas is in the layout of an integrated circuit.

The RC circuit may comprise a resistor in parallel or in series with the heterostructure. According to an embodiment, the device is a first component of a common integrated circuit, and the resistor is a second component of the common integrated circuit.

The device and a resistor can advantageously be formed as components of a common integrated circuit.

The common integrated circuit, the first component of the common integrated circuit, and the second component of the common integrated circuit may be characterized by features corresponding to the ones described in the context of a diode or a transistor forming the second component of the common integrated circuit.

The device may be employed as a component of a low pass filter, a high pass filter, or a band pass filter.

In particular, the RC circuit comprising the device as a component may be employed as a component of a low pass filter, a high pass filter, or a band pass filter.

The low pass filter, the high pass filter, or the band pass filter can have a cutoff frequency in a cutoff frequency range.

The band pass filter can have a second cutoff frequency in the cutoff frequency range.

The cutoff frequency range may comprise frequencies of at least 0.1 THz, in particular at least 1 THz or at least 0.2 THz.

The cutoff frequency range may comprise frequencies up to 1.00 THz, in particular up to 10 THz.

The low pass filter, the high pass filter, or the band pass filter may be an electronic low pass filter, an electronic high pass filter, or an electronic band pass filter.

The device may be employed as a component of a clock.

The device advantageously provides a resonance frequency in the terahertz frequency range, which is just above the frequency range being used by current electronics, and thus may permit to implement clocks operating at higher frequency and thus at higher precisions than the ones currently used in semiconductor devices.

Employing the device as a component of the clock may comprise determining a maximum or a minimum of a parameter that characterizes the oscillation of the polarization pattern.

Employing the device as a component of the clock may comprise counting a plurality of maxima or minima, wherein each maximum or minimum is a maximum or a minimum of the parameter related to the oscillation of the polarization pattern.

The parameter related to the oscillation of the polarization pattern may be a measure of the total polarization of the polarization pattern or a measure of the change of the total polarization of the polarization pattern.

The parameter related to the oscillation of the polarization pattern may be a measure of a local polarization of the polarization pattern, or a measure of the change of a local polarization of the polarization pattern.

The device may further comprise a second heterostructure comprising at least one second dielectric layer and at least one second ferroelectric layer. The second ferroelectric layer may comprise a second plurality of ferroelectric polarization domains forming a second polarization pattern, and the second polarization pattern may be adapted to perform a second oscillation with a second resonance frequency in the terahertz frequency range. Applying the device may further comprise employing the heterostructure as a component of a transmitter adapted to generate a transient terahertz electromagnetic wave, and employing the second heterostructure as a component of a receiver to receive the transient terahertz electromagnetic wave. This may be particularly useful for applications of the device related to intra-chip signal transmission and/or processing.

The second heterostructure may comprise a second plurality of ferroelectric layers. The plurality of ferroelectric layers may comprise at least three ferroelectric layers, in particular at least five, ten, twenty, or fifty ferroelectric layers.

According to an embodiment, the at least one second ferroelectric layer may be at least one ferroelectric layer of the second plurality of ferroelectric layers. The at least one second ferroelectric layer may be or comprise a thickest ferroelectric layer of the second plurality of ferroelectric layers, or a thinnest ferroelectric layer of the second plurality of ferroelectric layers.

In particular, each layer of the second plurality of ferroelectric layers may have a same second maximum ferroelectric layer thickness. In particular, each layer of the second plurality of ferroelectric layers may have a same second ferroelectric layer thickness, for example along a line intersecting the second heterostructure, in particular along a line intersecting the second heterostructure along a direction perpendicular to the second ferroelectric layer.

Alternatively, or in addition, the second heterostructure may comprise a second plurality of dielectric layers. The plurality of dielectric layers may comprise at least three ferroelectric layers, in particular at least five, ten, twenty, or fifty dielectric layers.

According to an embodiment, the at least one second dielectric layer may be a dielectric layer of the second plurality of dielectric layers. The at least one second dielectric layer may be or comprise a thickest dielectric layer of the second plurality of dielectric layers, or a thinnest dielectric layer of the second plurality of dielectric layers.

In particular, each layer of the second plurality of dielectric layers may have a same second maximum dielectric layer thickness. In particular, each layer of the second plurality of dielectric layers may have a same second dielectric layer thickness, for example along a line intersecting the second heterostructure, in particular along a line intersecting the second heterostructure along a direction perpendicular to the at least one second dielectric layer.

According to an embodiment, the heterostructure is a first component of a common integrated circuit, and the second heterostructure is a second component of the common integrated circuit.

The common integrated circuit, the first component of the common integrated circuit, and the second component of the common integrated circuit may be characterized by features corresponding to the ones described in the context of a diode or a transistor forming the second component of the common integrated circuit.

The method may further comprise guiding the transient terahertz electromagnetic wave using a waveguide structure.

The method may further comprise guiding the transient terahertz electromagnetic wave using a metallic channel, in particular a metallic channel serving as a plasmonic interconnect channel.

A waveguide structure and/or a plasmonic interconnect channel may be particularly useful for applications of the device related to intra-chip signal transmission and/or processing.

The method may further comprise using the device as a component of a terahertz optical device to manipulate the terahertz electromagnetic wave and to control at least one terahertz optical parameter.

For example, the terahertz optical device may be a mirror to reflect the terahertz electromagnetic wave, and the terahertz optical parameter may be a reflectance.

For example, the terahertz optical device may be an attenuator to transmit a portion of the terahertz electromagnetic wave, and the terahertz optical parameter may be an attenuation.

For example, the terahertz optical device may be a beam splitter to reflect a portion of the terahertz electromagnetic wave and to transmit another portion of the terahertz electromagnetic wave, wherein the terahertz optical parameter is a reflectance and a second terahertz optical parameter may be a transmittance.

For example, the terahertz optical device may be a phase shifter to modify a phase of the terahertz electromagnetic wave, and the terahertz optical parameter may be a phase shift.

For example, the terahertz optical device may be a terahertz optical low pass filter, a terahertz optical high pass filter, or a terahertz optical band-pass filter for the terahertz electromagnetic wave, and the terahertz optical parameter may be a cutoff frequency.

Advantageously, techniques for the design of layered dielectric optics can be used to tailor the terahertz optical device to match the requirements of specific application, for example as a mirror, a beam splitter, an attenuator, a phase shifter, a dichroic mirror, a (terahertz) optical high pass filter, a (terahertz) optical low pass filter, a (terahertz) band pass filter, or as a (terahertz) optical notch filter.

For example, the terahertz optical device may be a guiding structure for the terahertz electromagnetic wave, and the terahertz optical parameter may be a direction of the terahertz electromagnetic wave. In particular, the terahertz optical device may comprise a terahertz optical metamaterial to guide the terahertz electromagnetic wave inside the heterostructure.

A thickness of the at least one ferroelectric layer may be adapted to control the terahertz optical parameter.

The method may further comprise applying a static electric field to the heterostructure to control the terahertz optical parameter.

The method may further comprise triggering the oscillation of the electrons of the electrical circuit to control the terahertz optical parameter.

The method may further comprise applying a mechanical stress to the heterostructure to control the terahertz optical parameter.

The heterostructure may be a first component of a common integrated circuit, and an additional terahertz optical device or an additional terahertz optoelectronic device may be a second component of the common integrated circuit.

The common integrated circuit, the first component of the common integrated circuit, and the second component of the common integrated circuit may be characterized by features corresponding to the ones described in the context of a diode or a transistor as the second component of the common integrated circuit.

The method may further comprise employing the device as a component of a receiver or a transmitter for the terahertz electromagnetic wave, in addition to using the device as a component of a terahertz optical device to manipulate the terahertz electromagnetic wave and to control at least one terahertz optical parameter.

In a second aspect, the disclosure relates to a device with a heterostructure adapted to be applied as a resonator for electrons of an electrical circuit or for a terahertz electromagnetic wave. The heterostructure comprises at least one dielectric layer and at least one ferroelectric layer. The ferroelectric layer comprises a plurality of ferroelectric polarization domains forming a polarization pattern. The polarization pattern is adapted to execute an oscillation with a resonance frequency in a terahertz frequency range. The device is adapted to couple the oscillation of the polarization pattern with an oscillation at a coupling frequency of the electrons of the electrical circuit or of the terahertz electromagnetic wave. The oscillation of the polarization pattern has an oscillation frequency in a second terahertz frequency range.

The device with the heterostructure can advantageously be applied in a method comprising at least some of the features described above.

The terahertz frequency range and/or the second terahertz frequency range may be defined as in the context of the first aspect of the disclosure.

The heterostructure may comprise a plurality of ferroelectric layers. The plurality of ferroelectric layers may comprise at least three ferroelectric layers, in particular at least five, ten, twenty, or fifty ferroelectric layers.

According to an embodiment, the at least one ferroelectric layer may be at least one ferroelectric layer of the plurality of ferroelectric layers. The at least one ferroelectric layer may be or comprise a thickest ferroelectric layer of the plurality of ferroelectric layers, or a thinnest ferroelectric layer of the plurality of ferroelectric layers.

In particular, each layer of the plurality of ferroelectric layers may have a same maximum ferroelectric layer thickness. In particular, each layer of the plurality of ferroelectric layers may have a same ferroelectric layer thickness, for example along a line intersecting the heterostructure, in particular along a line intersecting the heterostructure along a direction perpendicular to the at least one ferroelectric layer.

Alternatively, or in addition, the heterostructure may comprise a plurality of dielectric layers. The plurality of dielectric layers may comprise at least three dielectric layers, in particular at least five, ten, twenty, or fifty dielectric layers.

According to an embodiment, the at least one dielectric layer may be at least one dielectric layer of the plurality of dielectric layers. The at least one dielectric layer may be or comprise a thickest dielectric layer of the plurality of dielectric layers or a thinnest dielectric layer of the plurality of dielectric layers.

In particular, each layer of the plurality of dielectric layers may have a same maximum dielectric layer thickness. In particular, each layer of the plurality of dielectric layers may have a same dielectric layer thickness, for example along a line intersecting the heterostructure, in particular along a line intersecting the heterostructure along a direction perpendicular to the at least one dielectric layer.

The heterostructure can have a height of at least 5 nm, in particular of at least 100 nm, in particular of at least 500 nm, in particular of at least 1 µm.

The heterostructure may cover a lateral area of at most 25 $mm^2$, in particular of at most 500 $\mu m^2$, in particular of at most 100 $\mu m^2$, or of at most 10 $\mu m^2$, or at most 25 $nm^2$.

The polarization pattern may have a spatial periodicity along a lateral direction of the at least one ferroelectric layer. In particular, the polarization pattern may be a periodic polarization pattern.

According to an embodiment, a thickness of the at least one ferroelectric layer does not exceed 100 nm, in particular 70 nm, 40 nm, 30 nm or 5 nm.

In general, several or all ferroelectric layers of the plurality of ferroelectric layers may have an identical thickness. In other embodiments, a thickness of several or all ferroelectric layers of the plurality of ferroelectric layers may differ.

In embodiments with a plurality of ferroelectric layers, a thickness of some or any of the ferroelectric layers comprised in the plurality of ferroelectric layers may not exceed 100 nm, in particular 70 nm, 40 nm, 30 nm or 5 nm.

The at least one ferroelectric layer may comprise lead titanate, barium titanate, zirconium oxide or hafnium oxide. In embodiments with a plurality of ferroelectric layers, a first ferroelectric layer of the plurality of ferroelectric layers and a second ferroelectric layer of the plurality of ferroelectric layers may be composed of the same material or of different materials.

According to an embodiment, a thickness of the at least one dielectric layer comprised in the plurality of dielectric layers does not exceed 100 nm, in particular 70 nm, 40 nm, 30 nm or 5 nm.

In general, several or all dielectric layers of the plurality of dielectric layers may have an identical thickness. In other embodiments, a thickness of several or all dielectric layers of the plurality of dielectric layers may differ.

In embodiments with a plurality of dielectric layers, a thickness of some or any of the dielectric layers comprised in the plurality of dielectric layers may not exceed 100 nm, in particular 70 nm, 40 nm, 30 nm or 5 nm.

The at least one dielectric layer may comprise insulating material, for example strontium titanate. In embodiments with a plurality of dielectric layers, a first dielectric layer of the plurality of dielectric layers and a second dielectric layer of the plurality of dielectric layers may be composed of the same material, or of different materials.

The device may further comprise a bottom electrode arranged below the heterostructure.

In particular, in embodiments with a plurality of dielectric layers and/or a plurality of ferroelectric layers, the bottom electrode may be arranged below the plurality of dielectric layers and/or below the plurality of ferroelectric layers.

The device may further comprise a top electrode arranged above the heterostructure. In particular, in embodiments with a plurality of dielectric layers and/or a plurality of ferroelectric layers, the top electrode may be arranged above the plurality of dielectric layers and/or above the plurality of ferroelectric layers.

The device may further comprise at least one intermediate electrode arranged between an intermediate top layer and an intermediate bottom layer.

In embodiments with a heterostructure comprising one dielectric layer and one ferroelectric layer, the intermediate top layer may be the ferroelectric layer or the dielectric layer, and the intermediate bottom layer may be the dielectric layer or the ferroelectric layer, respectively.

In embodiments with a plurality of dielectric layers, the intermediate bottom layer may be a dielectric layer from the plurality of dielectric layers, and/or the intermediate top layer may be a dielectric layer from the plurality of dielectric layers.

In embodiments with a plurality of ferroelectric layers, the intermediate bottom layer may be a ferroelectric layer from the plurality of ferroelectric layers, and/or the intermediate top layer may be a ferroelectric layer from the plurality of ferroelectric layers.

The structure and material composition of the intermediate electrode may generally correspond to those of the bottom electrode and top electrode described above.

An intermediate electrode located within the heterostructure may allow for more versatile application of the resonator.

Each of the bottom electrode, top electrode and bottom electrode may be adapted to be connected to an external driving circuitry, or to ground.

The heterostructure may be arranged above a substrate.

The substrate may be structured to promote the formation of the device.

Advantageously, additional elements may be formed on the same device to implement complex integrated circuitry. Moreover, the device may be selected to promote the formation of at least one layer of the device, for example via the wetting properties of the substrate or via epitaxial growth of at least one layer of the device on the substrate.

The substrate may be a semiconductor or dielectric substrate.

Semiconductor or dielectric substrates are well developed, available at moderate pricing, and the formation of a layer on semiconductor or dielectric substrates has been highly developed in the context of layer deposition technology.

The substrate may comprise a single crystalline section with a lateral dimension at least as large as a lateral dimension of the heterostructure. In particular, the substrate may be adapted to promote epitaxial growth of the at least one dielectric layer or of the at least one ferroelectric layer.

Crystalline sections of the substrate may promote epitaxial growth of at least one layer of the device. Epitaxial growth tends to minimize the density of defects in the layer.

The device may be a mechanically flexible device.

In particular, the device may be a free-standing device.

The device may further comprise an additional integrated element, wherein the heterostructure is a first component of a common integrated circuit, and the additional integrated element is a second component of the common integrated circuit.

The common integrated circuit, the first component of the common integrated circuit, and the second component of the common integrated circuit may be characterized by features corresponding to the ones described in the context of the method with a diode or a transistor as the second component of the common integrated circuit.

For example, the additional integrated element may be a resistor. The resistor may be arranged in series or in parallel with the heterostructure.

For example, the additional integrated element may be a diode or a transistor. The diode or transistor may be functionally coupled to the heterostructure.

For example, the additional integrated element may be an additional terahertz optical device or an additional terahertz optoelectronic device.

For example, the additional integrated element may be an additional antenna coupled to the heterostructure.

In particular, the additional antenna may be a split ring resonator or a split disc resonator.

The device may further comprise a plurality of integrated elements, wherein each integrated element of the plurality of integrated elements may be a component of the common integrated circuit.

The device may further comprise a second heterostructure adapted to be applied as a second resonator for electrons of a second electrical circuit or for a second terahertz electromagnetic wave. The second heterostructure may comprise at least one dielectric layer and at least one second ferroelectric layer. The at least one second ferroelectric layer may comprise a second plurality of ferroelectric polarization domains forming a second polarization pattern. The second polarization pattern may be adapted to execute a second oscillation with a second resonance frequency in the terahertz frequency range. The device may be adapted to couple the second oscillation of the second polarization pattern with a third oscillation at a second coupling frequency of the electrons of the second electrical circuit or of the second terahertz electromagnetic wave. The second oscillation of the second polarization pattern may have a second oscillation frequency in the second terahertz frequency range.

In some embodiments, the design and features of the second heterostructure may correspond to those of the heterostructure described above, such as in terms of the layout, the number and position of the ferroelectric layers and the dielectric layers, the layer thicknesses and material composition.

The second heterostructure may comprise a second plurality of ferroelectric layers. The plurality of ferroelectric layers may comprise at least three ferroelectric layers, in particular at least five, ten, twenty, or fifty ferroelectric layers.

In particular, the at least one second ferroelectric layer may be at least one ferroelectric layer of the second plurality of ferroelectric layers. The at least one second ferroelectric layer may be or comprise a thickest ferroelectric layer of the second plurality of ferroelectric layers, or a thinnest ferroelectric layer of the second plurality of ferroelectric layers.

According to an embodiment, each layer of the second plurality of ferroelectric layers may have a same second maximum ferroelectric layer thickness. In particular, each layer of the second plurality of ferroelectric layers may have a same second ferroelectric layer thickness, for example along a line intersecting the second heterostructure, in particular along a line intersecting the second heterostructure along a direction perpendicular to the at least one second ferroelectric layer.

Alternatively, or in addition, the second heterostructure may comprise a second plurality of dielectric layers. The plurality of dielectric layers may comprise at least three ferroelectric layers, in particular at least five, ten, twenty, or fifty dielectric layers.

In particular, the at least one second dielectric layer may be at least one dielectric layer of the second plurality of dielectric layers. The at least one second dielectric layer may be or comprise a thickest dielectric layer of the second plurality of dielectric layers, or a thinnest dielectric layer of the second plurality of dielectric layers.

According to an embodiment, each layer of the second plurality of dielectric layers may have a same second maximum dielectric layer thickness. In particular, each layer of the second plurality of dielectric layers may have a same second dielectric layer thickness, for example along a line intersecting the second heterostructure, in particular along a line intersecting the second heterostructure along a direction perpendicular to the at least one second dielectric layer.

The second resonance frequency may be selected from a second plurality of resonance frequencies of the second heterostructure and/or of the second polarization pattern.

In particular, the second resonance frequency may correspond to a principal resonance frequency of the second plurality of resonance frequencies of the second heterostructure and/or of the second polarization pattern.

The second resonance frequency may match the resonance frequency.

Matching frequencies may deviate from one another at most by a factor of 2, in particular at most 1.5, or at most 1.1.

The second terahertz electromagnetic wave and the terahertz electromagnetic wave may be identical, and the device may be adapted to couple the oscillation of the polarization pattern and the second oscillation of the second polarization pattern using the terahertz electromagnetic wave.

In a third aspect, the disclosure relates to a method of fabricating a device with a heterostructure. The device with the heterostructure is suitable to be applied as a resonator for electrons of an electrical circuit or for a terahertz electromagnetic wave. The method comprises depositing at least one ferroelectric layer and at least one dielectric layer, wherein a ferroelectric layer thickness of the at least one ferroelectric layer does not exceed a predefined maximum thickness, such that the at least one ferroelectric layer comprises a plurality of ferroelectric polarization domains forming a polarization pattern adapted to perform an oscillation with a resonance frequency. The method further comprises adjusting the predefined maximum thickness to a resonance frequency in a terahertz frequency range.

The method may further comprise depositing a plurality of ferroelectric layers. For example, depositing a plurality of ferroelectric layers may comprise depositing at least three ferroelectric layers, in particular at least five, ten, twenty, or fifty ferroelectric layers.

In particular, the at least one ferroelectric layer may be comprised in the plurality of ferroelectric layers. The at least one ferroelectric layer may be deposited to be or comprise a thickest ferroelectric layer of the plurality of ferroelectric layers or a thinnest ferroelectric layer of the plurality of ferroelectric layers.

According to an embodiment, each layer of the plurality of ferroelectric layers may be deposited with a same ferroelectric layer thickness, for example along a line intersecting the heterostructure, in particular along a line intersecting the heterostructure along a direction perpendicular to the at least one ferroelectric layer.

Alternatively, or in addition, the method may comprise depositing a plurality of dielectric layers. For example, depositing a plurality of dielectric layers may comprise depositing at least three dielectric layers, in particular at least five, ten, twenty, or fifty dielectric layers.

In particular, the plurality of dielectric layers may comprise the at least one dielectric layer. The at least one dielectric layer may be deposited to be or comprise a thickest dielectric layer of the plurality of dielectric layers, or a thinnest dielectric layer of the plurality of dielectric layers.

According to an embodiment, each layer of the plurality of dielectric layers may be deposited with a same dielectric layer thickness, for example along a line intersecting the heterostructure, in particular along a line intersecting the heterostructure along a direction perpendicular to the at least one dielectric layer.

The predefined maximum thickness may comprise a largest thickness of the at least one ferroelectric layer along a lateral direction of the heterostructure.

In embodiments with a top electrode and a bottom electrode, the predefined maximum thickness may comprise the largest thickness of the at least one ferroelectric layer in a volume between the top electrode and the bottom electrode.

In embodiments with a plurality of ferroelectric layers, the predefined maximum thickness may be a thickness of a thickest ferroelectric layer of the plurality of ferroelectric layers along a line intersecting the heterostructure, in particular along a line perpendicular to the plurality of ferroelectric layers.

In embodiments with a top electrode and a bottom electrode and a plurality of ferroelectric layers, the predefined maximum thickness may comprise a thickness of a thickest ferroelectric layer of the plurality of ferroelectric layers along a line connecting the bottom electrode and the top electrode, in particular a line perpendicular to the bottom electrode and the top electrode.

Alternatively, or in addition, the method may comprise adjusting a ratio of the ferroelectric layer thickness and a dielectric constant of the at least one ferroelectric layer.

The terahertz frequency range may comprise frequencies of at least 0.05 THz, in particular at least 0.1 THz or at least 0.2 THz.

The terahertz frequency range may comprise frequencies up to 20 THz, in particular up to 10 THz or up to 3 THz.

According to an embodiment, adjusting the predefined maximum thickness comprises selecting the predefined maximum thickness in accordance with a material constant of a material comprised in the at least one ferroelectric layer. In particular, the material constant of the material comprised in the at least one ferroelectric layer may be the dielectric constant of the material comprised in the at least one ferroelectric layer.

Adjusting the predefined maximum thickness may comprise selecting the predefined maximum thickness in accordance with a lateral area of the at least one ferroelectric layer.

Adjusting the predefined maximum thickness may comprise selecting the predefined maximum thickness in accordance with a dielectric constant of a material comprised in the at least one dielectric layer.

Adjusting the predefined maximum thickness may comprise selecting the predefined maximum thickness in accordance with a thickness of the at least one dielectric layer.

In embodiments with a plurality of dielectric layers and/or a plurality of ferroelectric layers, adjusting the predefined maximum thickness may comprise selecting the predefined maximum thickness in accordance with a number of the dielectric layers and/or a number of the ferroelectric layers.

Adjusting the predefined maximum thickness may comprise selecting the predefined maximum thickness in accordance with an average size of the ferroelectric polarization domains.

Adjusting the predefined maximum thickness may comprise selecting the predefined maximum thickness in accordance with a size distribution of the ferroelectric polarization domains.

The present disclosure relates to a device with a heterostructure comprising a plurality of ferroelectric layers. The device may provide a strong frequency dependence of the dielectric permittivity within a terahertz (THz) frequency range.

The terahertz frequency is not uniquely defined, and in the context of the present disclosure may be understood to start at a frequency of 0.05 THz, in particular 0.1 THz or 0.2 THz. Correspondingly, the terahertz frequency range may comprise frequencies up to 20 THz, in particular up to 10 THz or up to 3 THz. According to one possible definition, a THz spectral range may correspond to wavelengths in a range from 1 mm to 0.1 mm. The terahertz electromagnetic spectrum may generally be understood to lie between microwaves and far infrared.

The device with a heterostructure according to claim 1 will in the following be explained by way of the example of a Terahertz Ferroelectric Resonator (TFR).

Figure 1A:
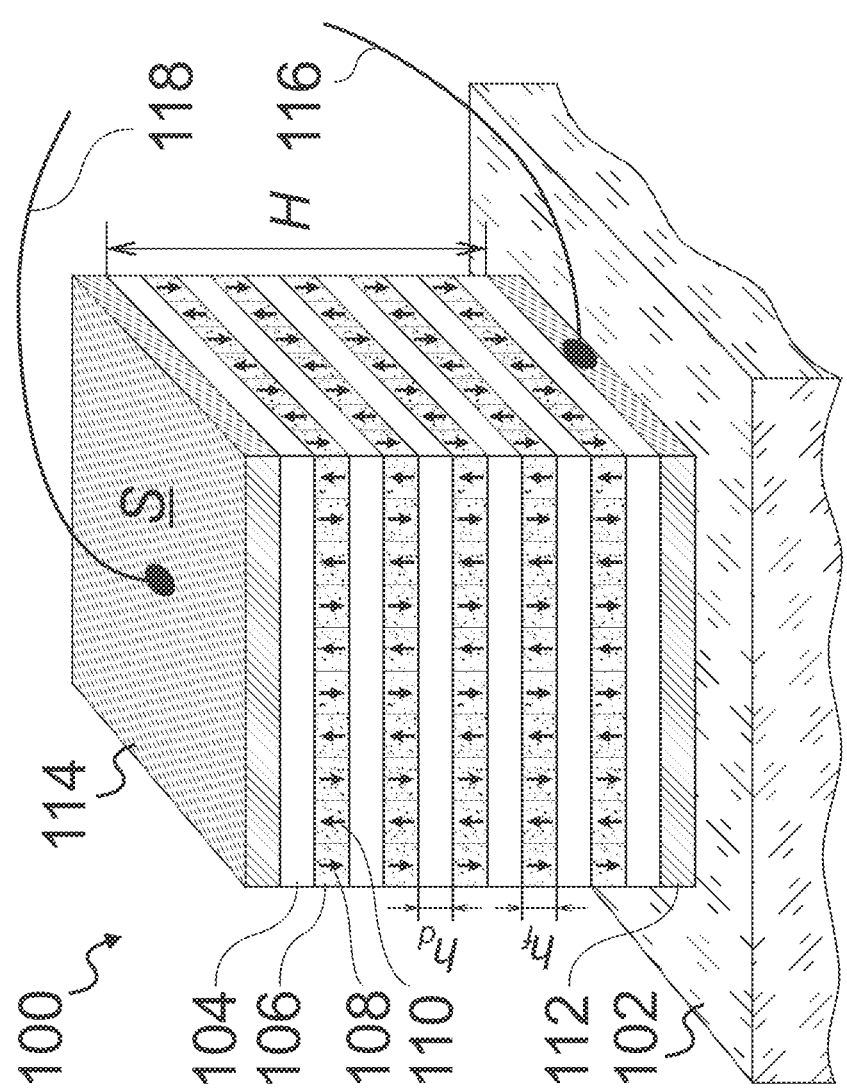
FIG. 1a shows a Terahertz Ferroelectric Resonator (TFR) according to an embodiment of the disclosure, with a thickness $h_d$ of an individual dielectric layer, a thickness $h_f$ of an individual ferroelectric layer, an overall thickness H of a heterostructure, and an area of a top surface S.

FIG. 1a illustrates an example of a TFR 100. The exemplary TFR 100 comprises a heterostructure, which may be a sandwich-like heterostructure, a multilayer structure, or a superlattice. The heterostructure may be deposited, for instance, on a dielectric or semiconductor substrate 102. The TFR 100 comprises an alternating sequence of layers, including a plurality of dielectric layers 104 and a plurality of ferroelectric layers 106. The example TFR 100 of FIG. 1a comprises six dielectric layers 104 and five ferroelectric layers 106, but other embodiments of the TFR 100 may comprise different numbers of layers, for example one ferroelectric layer and one dielectric layer, or any other number of ferroelectric layers and/or dielectric layers, depending on the application.

The heterostructure of the TFR 100 can be realized, for example, as an epitaxial grown superlattice wherein one, several or all of the dielectric layers 104 are mostly composed of $SrTiO_3$ perovskite oxide and one, several or all the ferroelectric layers 106 are mostly composed of $PbTiO_3$ perovskite oxide. Alternatively, the ferroelectric layers 106 may for example comprise other oxides with the perovskite structure, such as barium titanate or lead zirconium titanate, or non-perovskite oxides, such as zirconium oxide or hafnium oxide, in particular doped hafnium oxide. Other material compositions, comprising, for example, halides, are possible.

A typical thickness ha of an individual layer of the dielectric layers 104 and typical thickness $h_f$ of the ferroelectric layers 106 can be in a range from a few nm to tens of nm. The number of dielectric layers 104 and the number of ferroelectric layers 106 can vary from a few to tens to hundreds or even more. In the example, the overall thickness H of the dielectric layers 104 and ferroelectric layers 106, and the lateral area of the device, which may be related to the area of the top surface S of the device, do not exceed the characteristic terahertz wavelength in the heterostructure $\lambda/\sqrt{\varepsilon} \approx 10$ μm (with the dielectric constant $\varepsilon \approx 100$ and $\lambda \approx 100$ μm for the wavelength of an electromagnetic wave with the frequency of 3 THz terahertz in vacuum) to avoid parasite inductivity.

The ferroelectric material possesses ferroelectric polarization domains 108, 110 with uniaxial anisotropy of the polarization, which may either occur naturally or be strain-induced and/or be tailored by strain engineering. For this purpose, an epitaxial relationship between the dielectric layers 104 in the ferroelectric layers 106 may be useful, although not necessary. Moreover, a dielectric relationship between the dielectric layer 104 or the ferroelectric layers 106 and the substrate 102 may be useful, but not necessary.

According to the example depicted in FIG. 1a, the polarization of the ferroelectric polarization domains 108, 110 is directed along the z-axis, which is defined along the surface normal of the layers of the heterostructure. Other orientations of the polarization are, however, possible.

The ferroelectric layers 106 of the heterostructure of FIG. 1a are insulating, and the heterostructure is insulating. It is confined in between a bottom electrode 112 and a top electrode 114. Each of the bottom electrode 112 and the top electrode 114 can have a thickness in the range from 1 to 10 nm and comprises metallic or semiconducting material. The combination of the bottom electrode 112, the top electrode 114, and the heterostructure with the dielectric layers 104 and the ferroelectric layers 106 can be viewed as an effective capacitor. The TFR 100 can for example be produced by subsequent and/or alternating deposition of the dielectric layers 104 and the ferroelectric layers 106 on the substrate 102. In this case, the bottom electrode 112 is deposited on the substrate 102 prior to the deposition of the heterostructure. Consequently, at least a portion of the bottom electrode 112 is arranged between the substrate 102 and the heterostructure of the TFR 100. The top electrode 114 can be fabricated above the heterostructure in an additional deposition process after the deposition of the heterostructure. A bottom contact 116 can be attached to the bottom electrode 112, and a top contact 118 can be attached to the top electrode 114 for implementation of the electrical connection with an external circuit.

FIG. 1b illustrates the electronic graphical symbol 130 for the TFR 100.

A peculiarity of the alternating combination of the dielectric layers 104 and ferroelectric layers 106 is that the polarization of each ferroelectric layer 106 terminates at the corresponding dielectric-ferroelectric interfaces and creates interface depolarization charges. The interface depolarization charges are positive at the head of the polarization termination, corresponding to a dielectric-ferroelectric interface of an individual ferroelectric layer 106 of the heterostructure, and negative at its tail, corresponding to the opposite dielectric-ferroelectric interface of the same individual ferroelectric layer 106 of the heterostructure. The interface depolarization charges cause depolarization fields. The depolarization fields induced by the interface depolarization charges are energetically costly. This leads to the formation of ferroelectric polarization domains forming a polarization pattern. The polarization pattern may have a spatial periodicity along one or both lateral directions of the film.

Figure 2A:
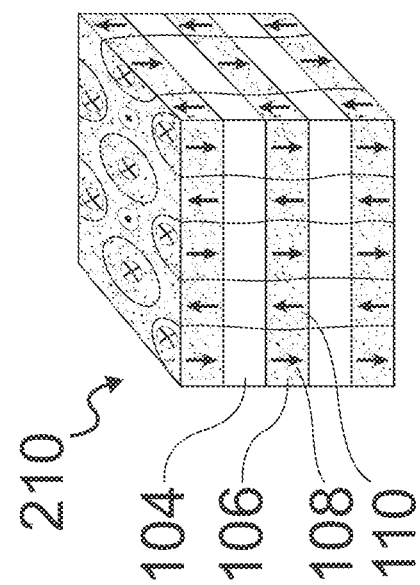
FIG. 2a shows a heterostructure of the Terahertz Ferroelectric Resonator (TFR) with a periodic polarization pattern with stripes according to an embodiment of the disclosure.
Figure 2B:
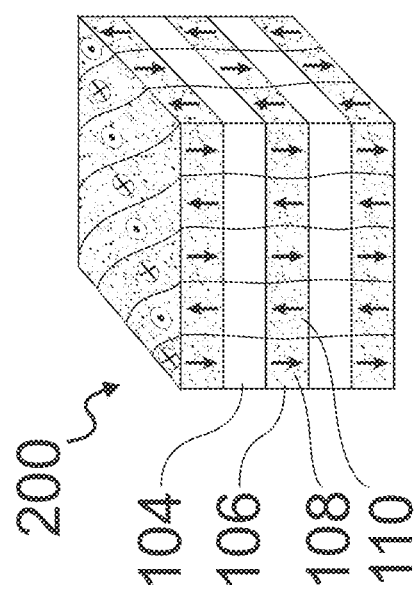
FIG. 2b shows a heterostructure of the Terahertz Ferroelectric Resonator (TFR) with a cylindrical, or bubble-like periodic polarization pattern according to another embodiment of the disclosure.

FIG. 2a and FIG. 2b show examples of periodic polarization patterns of heterostructures 200, 210. The heterostructure 200 in FIG. 2a has a periodic polarization pattern with stripes. The heterostructure 210 in FIG. 2b has a cylindrical, or bubble-like, periodic polarization pattern. For example, if the ferroelectric layers 106 are composed of PbTiO$_3$, the periodic polarization pattern of FIG. 2a may have a periodicity of 5-20 nm of the ferroelectric polarization domains 108, 110. The periodic polarization pattern and the resulting reduction of the depolarization charges of the ferroelectric polarization domains 108, 110 can substantially reduce the electrostatic energy related to the depolarization charges.

The polarization pattern, for example the periodic polarization patterns of heterostructures 200, 210 of FIG. 2a and FIG. 2b, can perform an oscillation. The coupling of the oscillation of the polarization pattern with a sub-THz to THz signal constitutes an important aspect of the disclosure. Here, the sub-THz to THz signal may have a frequency in a terahertz frequency range. The terahertz frequency range of the sub-THz to THz signal may correspond to the terahertz frequency range of the resonance frequency to promote resonant coupling, or may be a wider frequency range in case of non-resonant coupling. The sub-THz to THz signal may be or may be related to an oscillation of electrons of an electrical circuit or to an oscillation of a terahertz electromagnetic wave.

On the structural level, the oscillation of the ferroelectric polarization domains 108, 110, or the oscillation of the polarization pattern, respectively, may be related to a dynamical vibration mode of a periodic polarization pattern with a resonance frequency. In particular, the oscillation of the ferroelectric polarization domains 108, 110, or the oscillation of the polarization pattern, respectively, may be related to an oscillation of the total polarization or to an oscillation of the local polarization. The oscillation of the polarization pattern can be coupled with the sub-THz to THz signal.

The disclosure may, but does not necessarily, advantageously make use of resonant coupling to achieve a strong and efficient coupling between the oscillation of the polarization pattern and the sub-THz to THz signal. Resonant coupling occurs when the frequency of the sub-THz to THz signal matches a resonance frequency. In this context, matching may refer to a matching within a factor of 2, in particular within a factor of 1.5 or 1.1.

In situations where the sub-THz to THz signal is a terahertz electromagnetic wave with a wavelength of 0.1-1 mm, the terahertz wavelength may exceed the thickness of the device, and in this case, the action of the terahertz electromagnetic wave can be considered as the one of a uniform time-dependent electric field acting on the TFR 100, which may be considered an effective capacitor-device. Hence, the response of the TFR 100 can be described by the effective dynamic frequency-dependent impedance, $Z_{TFR}$. In case of a heterostructure formed by N pairs of ferroelectric layers 106 and N pairs of dielectric layers 104, the effective dynamic frequency-dependent impedance $Z_{TFR}$ may be described as $$Z_{TFR} = \frac{1}{i\omega}\left(\frac{h_d}{\varepsilon_0\varepsilon_d S} + \frac{h_f}{\varepsilon_0\varepsilon_f S}\right)N, \quad (1)$$

where $h_d$ is the thickness of one of the dielectric layers 104, $\varepsilon_d$ is the dielectric constant of one of the dielectric layers 104, $h_f$ is the thickness of one of the ferroelectric layers 106, $\varepsilon_f$ is the dielectric constant of one of the ferroelectric layers 106, $\varepsilon_0$ is the dielectric permittivity of vacuum, and S is the lateral area of the heterostructure. The frequency-dependence of $\varepsilon_f$ in the frequency range of the sub-THz to THz signal is related to the oscillations of the polarization pattern and the corresponding resonances. It may hence be controlled by controlling the resonances, for example by controlling the resonance frequencies and dynamical vibration modes and/or selecting a specific dynamical vibration mode, for example a principal and/or main resonance mode with a main and/or principal resonance frequency.

As an example, the effect of a resonance corresponding to a specific dynamical vibration mode related to an alternating shrinking-expanding oscillation of a domain chain on $\varepsilon_f$ will be presented. For this example, $\varepsilon_f = \varepsilon_f(\omega)$ may be expressed in the following equation, which is derived in Luk'yanchuk et al., *Physical Review B* 98, 024107 (2018):

$$\varepsilon_f(\omega) = \frac{\omega_0^2 - \omega^2 - i\Gamma\omega}{(1-g^{-1})\omega_0^2 - \omega^2 - i\Gamma\omega}, \quad (2)$$

where $\Gamma$ is a damping factor, which is related to energy dissipation. For example, energy dissipation may be due to domain wall vibrations. A non-uniformity factor g~0.4-0.9 accounts for non-uniformities of an electric field distribution near an interface between one of the dielectric layers 104 and one of the ferroelectric layers 106.

Figure 3:
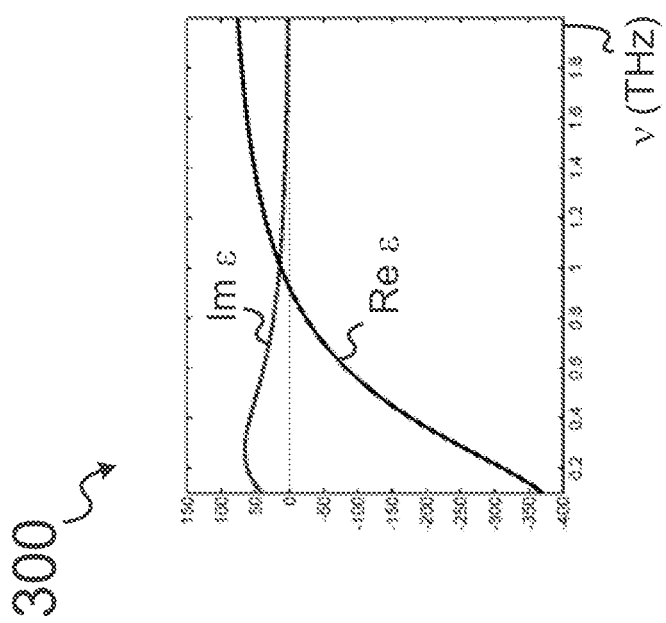
FIG. 3 shows an exemplary frequency-dependence of the real part Re ε and the imaginary part Im ε of a dielectric constant of a heterostructure of a Terahertz Ferroelectric Resonator (TFR) with a thickness $h_f$ of an individual ferroelectric layer of 25 nm according to an embodiment of the disclosure.

FIG. 3 illustrates an exemplary dielectric constant 300 as a function of frequency $\nu$ (THz) (where $\nu$ (THz)=$\omega/2\pi$) according to an embodiment of the disclosure. The dielectric constant has complex values, and in FIG. 3 the real part Re $\varepsilon$ of the dielectric constant 300 and the imaginary part Im $\varepsilon$ of the dielectric constant 300 are depicted separately. The resonance frequency $\nu_0 = \omega_0/2\pi$, may be read from the graph as the frequency at which the real part Re $\varepsilon$ of the dielectric constant 300 is zero. The resonance frequency is advantageously located in the frequency range of the sub-THz to THz signal.

Figure 4:
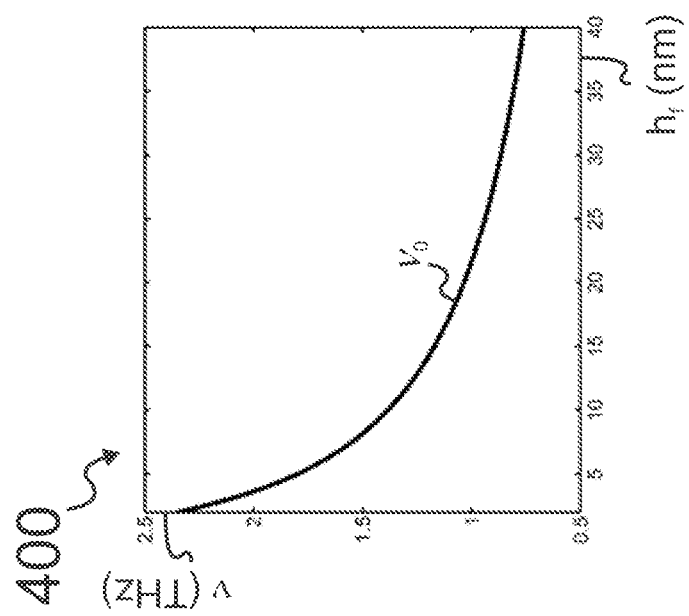
FIG. 4 shows an exemplary frequency-dependence of the resonance frequency of a heterostructure of a Terahertz Ferroelectric Resonator (TFR) according to an embodiment of the disclosure.

FIG. 4 shows a graph 400 illustrating the influence of the thickness $h_f$ of one of the ferroelectric layers on the resonance frequency $\nu_0$ (where $\nu_0 = \omega_0/2\pi$) according to an embodiment of the disclosure with a ferroelectric layer 106 composed of PbTiO$_3$ and a dielectric layer 104 composed of SrTiO$_3$. The thickness $h_f$ of the ferroelectric layer may advantageously be selected to adjust the resonance frequency. For example, a predefined maximum thickness of an individual layer of the heterostructure or a predefined maximum thickness of any of the layers of the heterostructure may be adjusted, for example to a value of 100 nm, in particular 70 nm or 40 nm. By doing so, the resonance frequency can advantageously be matched to a frequency of the sub-THz to THz signal to achieve a strong and efficient coupling between the oscillation of the polarization pattern and the sub-THz to THz signal, for example by resonant coupling. In addition, a material of the ferroelectric layer 106 and a material of the dielectric layer 104 can advantageously be selected to adjust the resonance frequency $\nu_0$. In addition, a static electric field and/or a mechanical stress can be applied to the heterostructure advantageously to adjust the resonance frequency $\nu_0$.

Figure 5:
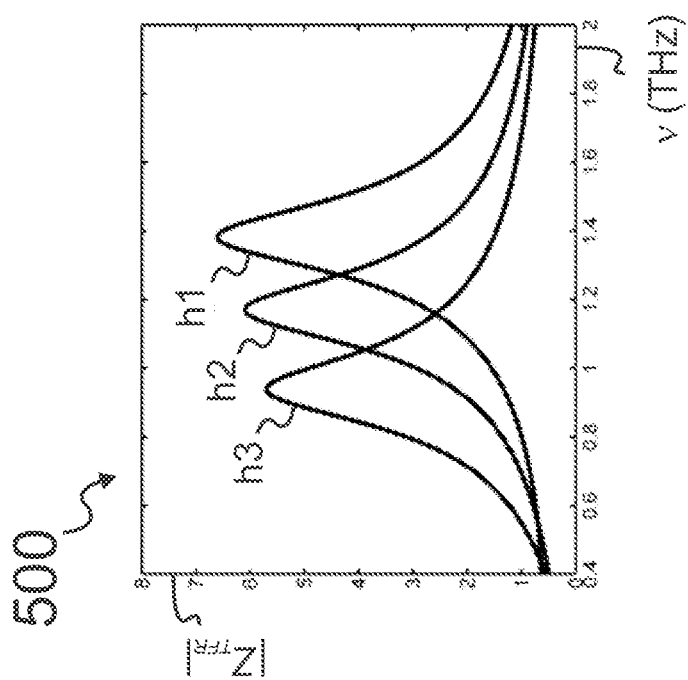
FIG. 5 shows exemplary frequency-dependences of impedance amplitudes of the Terahertz Ferroelectric Resonators (TFRs) for different thicknesses, h1, h2, h3, according to three embodiments of the disclosure, where h1 corresponds to $h_f=h_d=10$ nm, h2 corresponds to $h_f=h_d=15$ nm, and h3 corresponds to $h_f=h_d=20$ nm.

FIG. 5 shows the dependence of the impedance amplitude $|Z_{TFR}|$ on the frequency $\nu$ (THz). The graph 500 gives the impedance amplitude $|Z_{TFR}|$ for three different thicknesses of the ferroelectric layer, where h1 corresponds to $h_f = h_d = 10$ nm, h2 corresponds to $h_f = h_d = 15$ nm, and h3 corresponds to $h_f = h_d = 20$ nm. The impedance amplitude $|Z_{TFR}|$ has a maximum at a frequency similar or identical to the resonance frequency $\nu_0$. The frequency-dependence of the impedance amplitude of the heterostructure is similar to the frequency-dependence of the impedance amplitude of well-known electronic components, like for example parallel LC resonant circuits. Hence, the heterostructure and the TFR 100 device may be employed in an electronic device like, for example, a signal receiver, a transmitter, or a processing device, operating in the frequency range of the sub-THz to THz signal, and the integration and application of the heterostructure and the TFR 100 device can advantageously make use of highly developed concepts for the integration and application of the well-known electronic components, like for example of the LC resonant circuit.

According to the disclosure, the thickness $h_f$ of the ferroelectric layer may advantageously be selected to adjust the resonance frequency $v_0$ and consequently the frequency-dependence of the impedance amplitude, in particular the frequency at which the impedance amplitude has a maximum. Again, also the material of the ferroelectric layer 106 and the material of the dielectric layer 104 can advantageously be selected, and/or a static electric field and/or a mechanical stress can be applied to the heterostructure to adjust the resonance frequency $\omega_0$.

Figure 6:
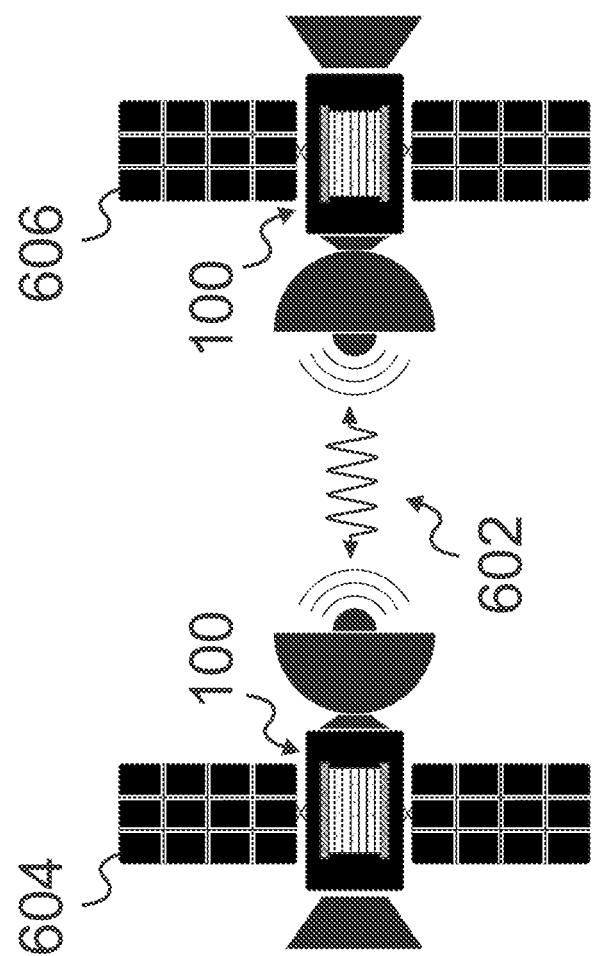
FIG. 6 shows a system for satellite communication comprising a Terahertz Ferroelectric Resonator (TFR) according to an embodiment of the disclosure.
Figure 7:
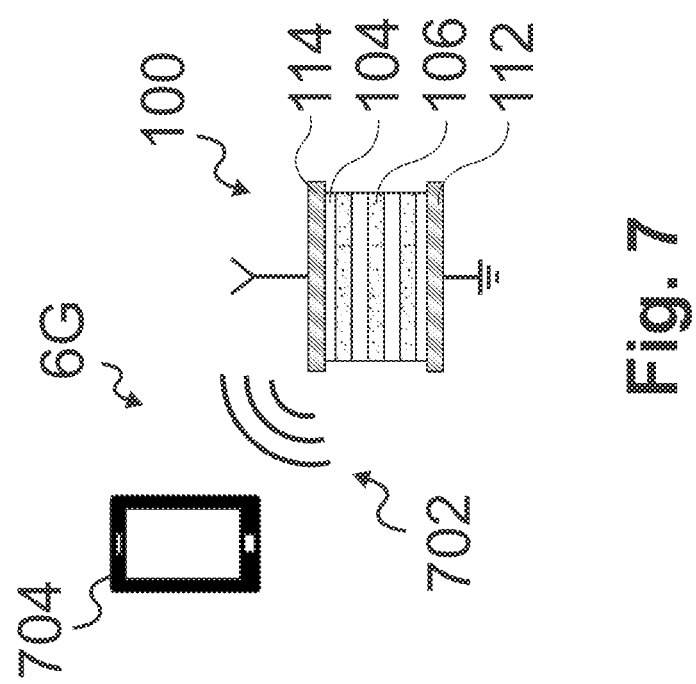
FIG. 7 shows a system for 6G wireless communication comprising a Terahertz Ferroelectric Resonator (TFR) according to an embodiment of the disclosure.

FIG. 6 and FIG. 7 illustrate example applications, for which a signal receiver, transmitter, or processing device using a TFR 100 and operating in the frequency range of the sub-THz to THz signal may be particularly beneficial.

For example, as illustrated in FIG. 6, a device employing a TFR 100 as a component of a transmitter and/or a receiver for a terahertz electromagnetic wave may find application in satellite communications. Terahertz electromagnetic waves 602 may be exchanged between a first satellite 604 and a second satellite 606, each comprising a transmitter and/or a receiver based on a TFR 100. The space between the satellites is transparent in the terahertz spectral range to permit the propagation of the terahertz electromagnetic waves 602. The TFR 100 and in particular an integrated circuit with a TFR 100 may provide highly energy-efficient communication means for the first satellite 604 and the second satellite 606, in an environment where energy efficiency is particularly important. The TFR 100 also provides lightweight communication means, which can reduce the cost of launching the first satellite 604 and the second satellite 606 into space. Importantly, resonant coupling between terahertz electromagnetic wave 602 and the TFR 100 provides frequency-selective communication means, suppressing noise from radiation at frequencies different from the resonance frequency of the TFR 100. This advantage may be particularly important in a space environment, where radiation at various frequencies may be abundant.

Moreover, as illustrated in FIG. 7, a device employing a TFR 100 as a component of a transmitter and/or a receiver for a terahertz electromagnetic wave may form a basis for 6G WiFi communication 6G in this frequency range. The TFR 100 may be highly integrated with other electric components of an integrated electric circuit of a communication hub or an end user device 704, thus providing a cost-efficient communication technology for consumer products. In particular, the same or similar TFRs 100 in a single device may be used for coupling to the electromagnetic wave 702 on the one hand, and for electronic signal processing within the integrated circuit on the other. Both the communication hub and the end user device 704 may comprise integrated circuits each with one or multiple TFRs 100.

The TFR 100 device according to the disclosure is advantageously compatible with the integration into existing, miniaturized and highly developed semiconductor technology and integrated circuitry. Because of its small lateral area, the TFR 100 may be co-integrated with semiconductor devices such as diodes or transistors.

Figure 8:
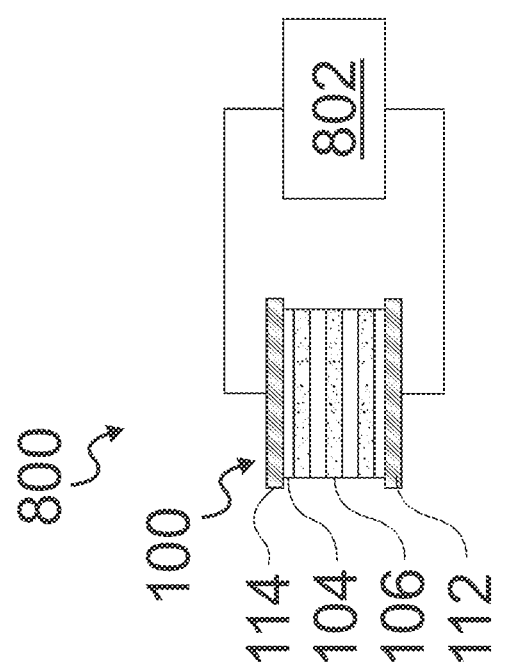
FIG. 8 shows an integrated circuit comprising a Terahertz Ferroelectric Resonator (TFR) according to an embodiment of the disclosure.

FIG. 8 illustrates an integrated circuit 800 with a TFR 100 and a semiconductor device 802 according to an embodiment of the disclosure. A portion of the TFR 100 device may be processed, for example deposited or structured, in a single process step together with a portion of the semiconductor device 802. For example, a layer of the TFR 100, such as a dielectric layer 104, a ferroelectric layer 106, or a bottom electrode 112 and/or a top electrode 114 of the TFR 100 device may be deposited together with a similar layer of the semiconductor device 802 in a single deposition step. Also, a layer of the TFR 100 device may be etched together with a layer of the semiconductor device in a single etching step. Also, a layer of the TFR 100 device may be masked together with a layer of the semiconductor device in a single masking step. A driver circuit to drive the transmitter for the terahertz electromagnetic wave or a readout circuit to read the receiver for the terahertz electromagnetic wave may be implemented making use of a semiconductor device 802 such as a diode or a transistor. For example, the heterostructure of the TFR 100 may be coupled to a diode or transistor 802, in particular to a gate of a transistor, to implement a rectifier converting the sub-THz to THz signal of the terahertz electromagnetic wave from an oscillation into a polar signal.

Frequency-dependent properties of a TFR 100 device, in particular the frequency-dependence of the impedance amplitude of the TFR 100, may advantageously be optimized for application in a specific device. In addition, the frequency-dependent impedance of a circuit comprising the TFR 100 device, like, for example, an RC circuit, may be optimized by integrating additional electric components, like a load resistor, in the circuit. A load resistor may either be implemented as a load resistor 900 integrated in series with the TFR 100 device as illustrated in FIG. 9a, or as a load resistor 920 integrated in parallel with the TFR as illustrated in FIG. 9c.

FIG. 9b and FIG. 9d show the corresponding circuit diagrams 910, 930 with the electronic graphical symbol 130 of the TFR 100, a resistor in series 912, and a resistor in parallel 932.

Implementing the circuit according to the circuit diagram 910 of FIG. 9b may be achieved by forming an extended top electrode 114 or an extended bottom electrode 112 integrating with an additional resistive part 902 composed of one or several, metallic or semiconducting layers, whose thickness and material composition may be selected to optimize the resistance according to the requirements of the application in a specific device.

Implementing the circuit according to the circuit diagram 930 of FIG. 9d may be achieved by integrating a parallel load as a shunt-like structure, with a metallic or semiconducting shunt 922 connecting the top electrode 114 and bottom electrode 112. The metallic or semiconducting shunt 922 may be arranged between the top electrode 114 and bottom electrode 112, or at least a portion of the metallic or semiconducting shunt 922 may be arranged outside the volume between the top electrode 114 and bottom electrode 112.

Figure 10:
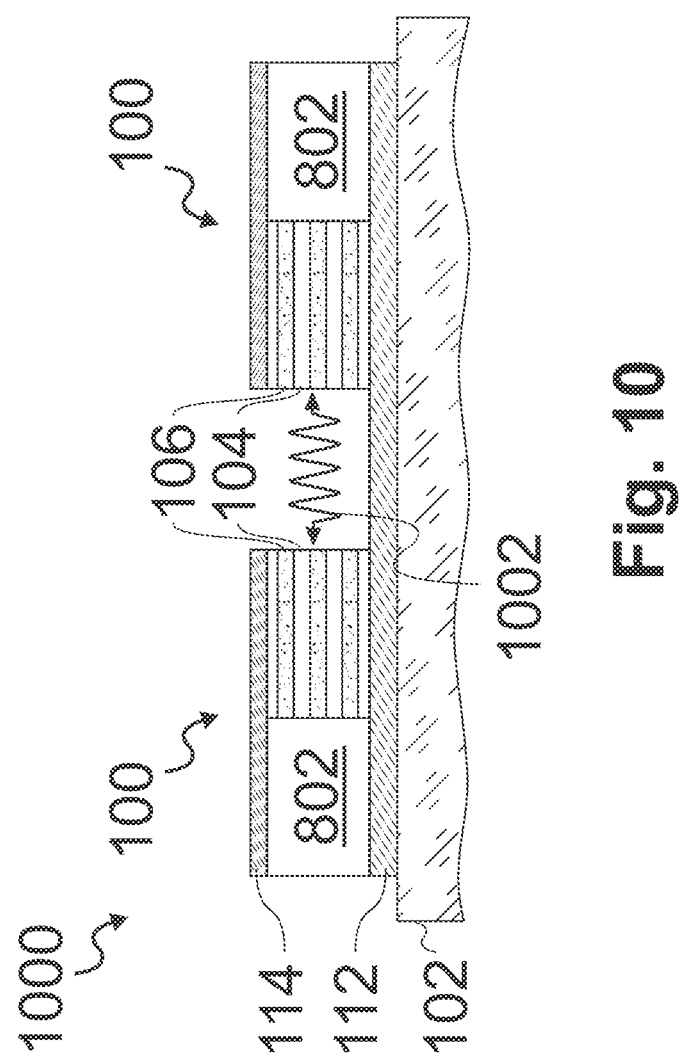
FIG. 10 shows two communicating Terahertz Ferroelectric Resonators (TFR) according to yet another embodiment of the disclosure.

FIG. 10 shows another example of an integrated circuit 1000 comprising two TFRs 100. Because of its small size, the TFR 100 can be co-integrated into a variety of integrated circuits. Additional examples of integrated circuits which may comprise and/or be based on the TFR 100 include a terahertz antenna, a transmitter and a receiver, which may also be referred to as a sensor of terahertz radiation. In particular, a device of an integrated circuit comprising the TFR 100 may be applied as a receiver to detect a sub-THz to THz signal emitted from another device of the integrated circuit.

Alternatively, or in addition, a device of an integrated circuit comprising the TFR 100 may be applied as a transmitter to generate a sub-THz to THz signal to be detected by another device of the integrated circuit. Advantageously, a transmitter based on the TFR 100 and a receiver based on the TFR 100 can be arranged on the same integrated circuit for the transmission, guiding, and/or manipulation of a sub-THz to THz signal. FIG. 10 shows an example of a corresponding integrated circuit 1000. In this example, the semiconductor devices 802 could, for example, correspond to a processor or a memory device. The TFR 100 may be used to establish a communication between the semiconductor devices 802 via a terahertz electromagnetic wave 1002. The terahertz electromagnetic wave 1002 may be an electromagnetic wave propagating freely in vacuum, gas, a dielectric or another form of matter, or it may be guided by a waveguide structure or it may be supported by a metallic channel, in particular by a plasmonic channel. In this embodiment, the TFR 100 serves as a component of the integrated electric circuit, for example as a transmitter, receiver, or transceiver, but it may in addition serve as a terahertz optical device, which will be described in more detail later.

Figure 11C:
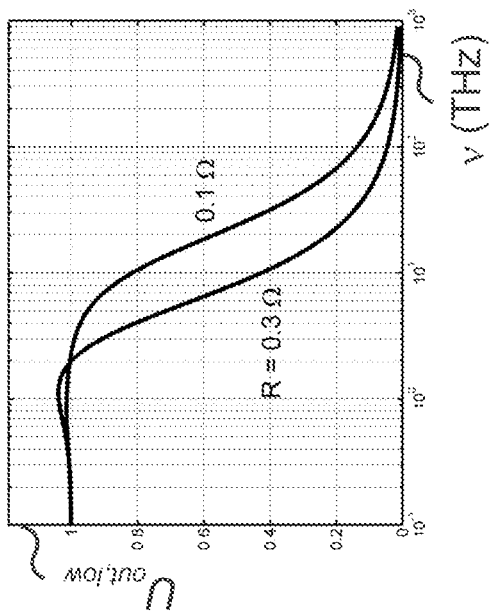
FIG. 11c shows the exemplary frequency-dependent output characteristics of a low pass filter according to the integrated circuit of FIG. 11a for different load resistances, comprising a Terahertz Ferroelectric Resonator (TFR) with $h_f$=10 nm, $h_d$=5 nm, H=1 µm and S=100 µm².
Figure 11B:
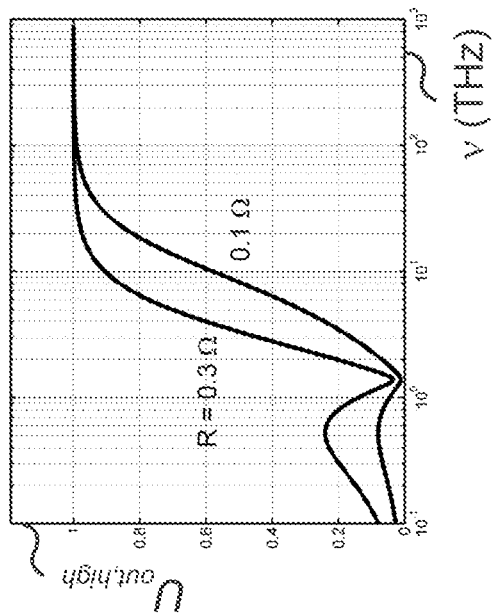
FIG. 11b shows the exemplary frequency-dependent output characteristics of a high pass filter according to the integrated circuit of FIG. 11a for different load resistances, comprising a Terahertz Ferroelectric Resonator (TFR) with $h_f$=10 nm, $h_d$=5 nm, H=1 µm and S=100 µm².
Figure 11A:
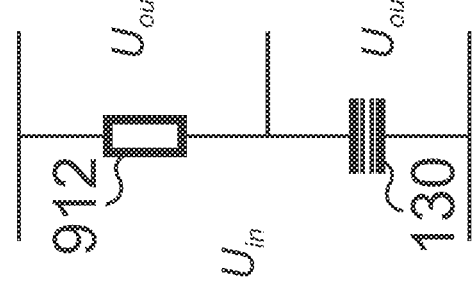
FIG. 11a shows a circuit diagram of an integrated circuit for high-pass and low-pass frequency filtering based on a Terahertz Ferroelectric Resonator (TFR) according to yet another embodiment of the disclosure.

FIG. 11a shows a circuit diagram 1100 corresponding to an embodiment of a frequency filter with a TFR 100. A circuit according to the circuit diagram 1100 may be employed as a low pass filter, a high pass filter, or a band-pass filter. The high pass filter may be implemented by placing an input voltage, $U_{in}$, across both the 100, 130 and the resistor in series 912 as depicted in FIG. 11a. The TFR 100, 130 has an impedance $Z_{TFR}(\omega)$. The resistor in series 912 has a resistance R, which is essentially independent of frequency. The high pass filter may be completed by using as an output voltage $U_{out,high}$ a voltage across the resistor in series 912. The output voltage $U_{out,high}$ may be described using the equation:

$$\left| \frac{U_{out,high}}{U_{in}} \right| = \frac{R}{R + Z_{TFR}(\omega)}. \tag{3}$$

FIG. 11b illustrates the frequency dependence of the output voltage $U_{out,high}$ 1110 of a high pass filter according to an embodiment of the disclosure.

A low-pass filter is realized by the same circuit where the voltage output, $U_{out,low}$, is taken from the TFR 130. FIG. 11c illustrates the frequency-dependent output voltage $U_{out,low}$ 1120 for the low-pass filter, as given by $$\left| \frac{U_{out,low}}{U_{in}} \right| = \frac{Z_{TFR}(\omega)}{R + Z_{TFR}(\omega)}. \tag{4}$$

Making use of the coupling of the TFR 100 to a terahertz electromagnetic wave, the TFR 100 can also be employed in a terahertz optical device to guide the terahertz electromagnetic wave and/or manipulate its properties, like its amplitude, phase, direction, or (in case of pulsed terahertz electromagnetic radiation) pulse shape. Advantageously, due to the layered structure of the heterostructure of the TFR 100, highly developed techniques for the design of layered dielectric optics can be used to tailor the TFR 100 to the requirements of a specific application, for example as a mirror, a beam splitter, an attenuator, a phase shifter, a dichroic mirror, a (terahertz) optical high pass filter, a (terahertz) optical low pass filter, a (terahertz) band pass filter, or a (terahertz) optical notch filter. Advantageously, the use of a device with the TFR 100 as a terahertz optical device may be combined with the use of the same device as an electronic resonator, for example as a receiver. In particular, a portion of the terahertz electromagnetic wave absorbed in the TFR 100 may be used for sensing, whereas another portion of the terahertz electromagnetic wave may be guided, reflected, or transmitted by the same TFR 100 serving as a terahertz optical device.

Figure 12:
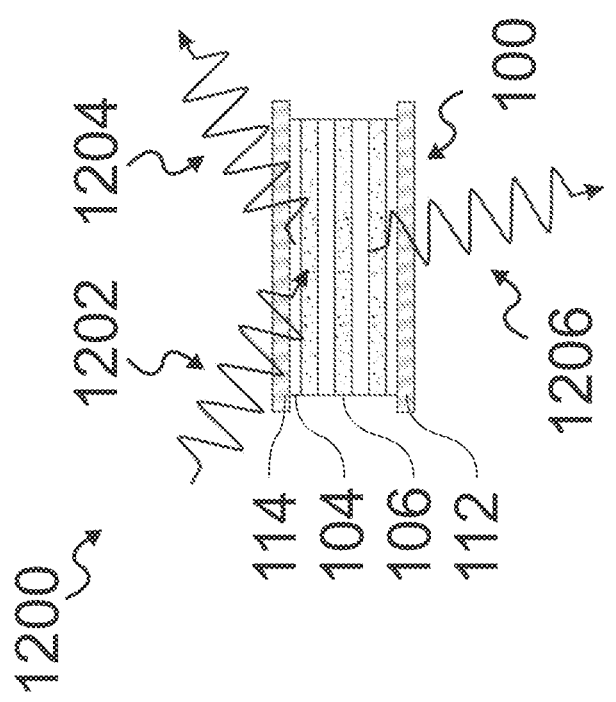
FIG. 12 shows a terahertz optical device according to an embodiment of the disclosure.

FIG. 12 shows an example of a terahertz optical device 1200 with a TFR 100 to manipulate a terahertz electromagnetic wave according to an embodiment of the disclosure. The terahertz optical device 1200 may reflect a portion of an incident terahertz electromagnetic wave 1202 to generate a reflected terahertz electromagnetic wave 1204. The device may also transmit a portion of the incident terahertz electromagnetic wave 1202 to generate a transmitted terahertz electromagnetic wave 1206. Moreover, the terahertz optical device 1200 may absorb a portion of the incident terahertz electromagnetic wave 1202. The terahertz optical device 1200 may use the portion of the incident terahertz electromagnetic wave 1202 absorbed by the device for electronic signal processing, for example for sensing the incident terahertz electromagnetic wave 1202.

Figure 13A:
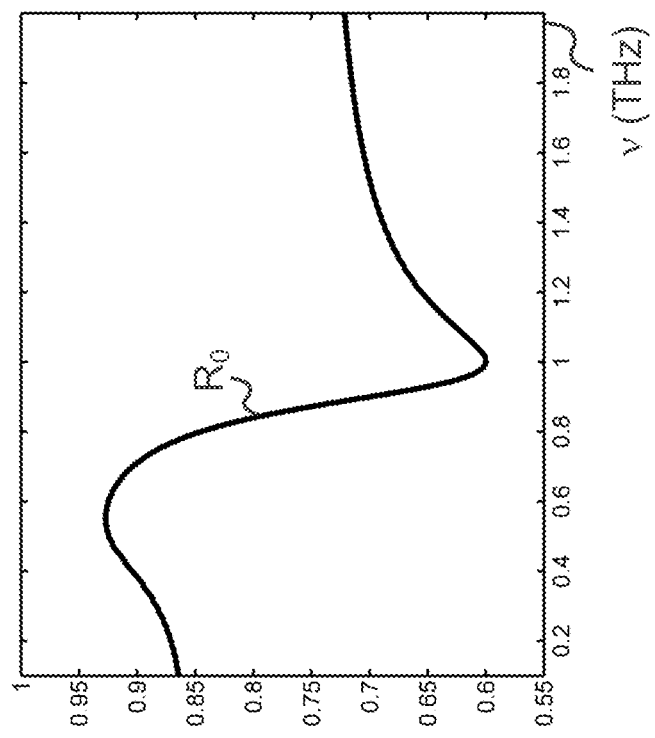
FIG. 13a shows the frequency-dependent refractive index of a terahertz optical device with $h_f$=$h_d$=25 nm according to an embodiment of the disclosure, in terms of its real part Re n and its imaginary part Im n.
Figure 13B:
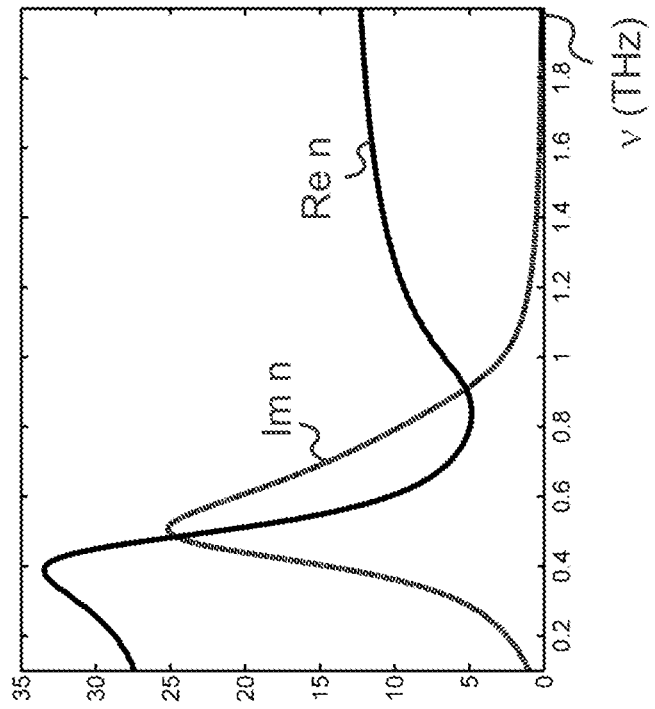
FIG. 13b shows the terahertz frequency-dependent optical reflection coefficient $R_o$ at normal incidence of a terahertz optical device with $h_f$=$h_d$=25 nm according to an embodiment of the disclosure.

FIG. 13a and FIG. 13b illustrate the optical properties as a function of frequency v (THz) of a heterostructure according to an embodiment of the disclosure. FIG. 13a shows the complex refractive index $n=\sqrt{\varepsilon}$ 1300. Since the complex refractive index 1300 is a complex quantity, the real part Re n of the complex refractive index 1300 and the imaginary part Im n of the complex refractive index 1300 are given separately. FIG. 13b gives the corresponding terahertz optical reflection coefficient $R_o$ for normal incidence. The terahertz optical reflection coefficient $R_o$ may be related to the complex refractive index $n=\sqrt{\varepsilon}$ 1300 as:

$$R_0 = \left| \frac{n-1}{n+1} \right|^2. \tag{5}$$

Properties of the layers of the heterostructure of the TFR 100, like the dielectric layers 104, the ferroelectric layers 106, the bottom electrode 112 and the top electrode 114 may be adjusted using the highly developed techniques for the design of layered dielectric optics. In particular, the properties of the layers of the heterostructure can be adjusted to achieve a desired amplitude, phase, or direction of the reflected terahertz electromagnetic wave 1204 and/or of the transmitted terahertz electromagnetic wave 1206. For example, the thicknesses and the material compositions of the layers of the heterostructure may be adjusted. Alternatively or in addition, a static electric field and/or a mechanical stress can be applied to the heterostructure, constantly or dynamically (e. g for terahertz optical switching), to adjust the resonance frequency $\omega_0$. The terahertz optical device with a TFR 100 may, for example, advantageously be applied in wireless terahertz communication technologies or for on-chip wireless signal transmittance and processing. In some of these applications, it may be useful to adjust the thickness of the heterostructure to exceed or be comparable with the radiation wavelength. This may complicate the deposition of a bottom electrode 112 or a top electrode 114. Advantageously, in application where the terahertz optical device 1200 is not used for electronic signal processing, the deposition of a top electrode 112 and/or a bottom electrode 114 may be omitted.

The description of the embodiments and the figures merely serves to illustrate the disclosure and the advantages associated therewith, but should not be construed to imply any limitation. The scope of the disclosure is to be determined from the appended claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of employing a device with a heterostructure as a resonator for electrons of an electrical circuit or for a terahertz electromagnetic wave, wherein:
    the heterostructure comprises at least one dielectric layer and at least one ferroelectric layer, wherein:
    the at least one ferroelectric layer comprises a plurality of ferroelectric polarization domains forming a polarization pattern, and wherein
    the polarization pattern is adapted to perform an oscillation with a resonance frequency in a terahertz frequency range; and
    wherein the method comprises:
    functionally coupling the oscillation of the polarization pattern and an oscillation of the electrons of the electrical circuit or of the terahertz electromagnetic wave by the device.

2. The method according to claim 1, wherein the method further comprises employing the device as a component of a receiver or a transmitter for the terahertz electromagnetic wave.

3. The method according to claim 1, wherein the method further comprises applying the device as a component of an RC circuit.

4. The method according to claim 1, wherein the method further comprises employing the device as a component of a low pass filter, a high pass filter, or a band pass filter.

5. The method according to claim 1, wherein the method further comprises using the device as a component of a clock.

6. The method according to claim 1, wherein the device further comprises a second heterostructure comprising at least one second dielectric layer and at least one second ferroelectric layer, wherein the at least one second ferroelectric layer comprises a second plurality of ferroelectric polarization domains forming a second polarization pattern, and wherein the second polarization pattern is adapted to perform a second oscillation with a second resonance frequency in the terahertz frequency range;
    wherein applying the device further comprises:
    employing the heterostructure as a component of a transmitter adapted to generate a transient terahertz electromagnetic wave; and
    employing the second heterostructure as a component of a receiver to receive the transient terahertz electromagnetic wave.

7. The method according to claim 1, wherein the method further comprises using the device as a component of a terahertz optical device to manipulate the terahertz electromagnetic wave and to control at least one terahertz optical parameter.

8. A device with a heterostructure adapted to be applied as a resonator for electrons of an electrical circuit or for a terahertz electromagnetic wave, wherein:
    the heterostructure comprises at least one dielectric layer and at least one ferroelectric layer, wherein:
    the at least one ferroelectric layer comprises a plurality of ferroelectric polarization domains forming a polarization pattern, and
    the polarization pattern is adapted to execute an oscillation with a resonance frequency in a terahertz frequency range;
    wherein the device is adapted to couple the oscillation of the polarization pattern with an oscillation at a coupling frequency of the electrons of the electrical circuit or of the terahertz electromagnetic wave, wherein the oscillation of the polarization pattern has an oscillation frequency in the terahertz frequency range.

9. The device according to claim 8, wherein the heterostructure comprises a plurality of dielectric layers and/or a plurality of ferroelectric layers.

10. The device according to claim 8, further comprising at least one of a bottom electrode arranged below the heterostructure, and a top electrode arranged above the heterostructure.

11. The device according to claim 8, wherein the heterostructure is arranged above a substrate.

12. The device according to claim 8, wherein the device is a mechanically flexible device.

13. The device according to claim 8, further comprising an additional integrated element, wherein the heterostructure is a first component of a common integrated circuit and the additional integrated element is a second component of the common integrated circuit.

14. The device according to claim 8, further comprising a second heterostructure adapted to be applied as a second resonator for electrons of a second electrical circuit or for a second terahertz electromagnetic wave, wherein:
    the second heterostructure comprises at least one second dielectric layer and at least one second ferroelectric layer, wherein:
    the at least one second ferroelectric layer comprises a second plurality of ferroelectric polarization domains forming a second polarization pattern, and
    the second polarization pattern is adapted to execute a second oscillation with a second resonance frequency in the terahertz frequency range;
    wherein the device is adapted to couple the second oscillation of the second polarization pattern with a third oscillation at a second coupling frequency of the electrons of the second electrical circuit or of the second terahertz electromagnetic wave, wherein the second oscillation of the second polarization pattern has a second oscillation frequency in the terahertz frequency range.

* * * * *